United States Patent
Wu et al.

(10) Patent No.: US 8,759,907 B2
(45) Date of Patent: Jun. 24, 2014

(54) MEMORY DEVICE HAVING BURIED BIT LINE AND VERTICAL TRANSISTOR AND FABRICATION METHOD THEREOF

(75) Inventors: Tieh-Chiang Wu, Taoyuan County (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 224 days.

(21) Appl. No.: 13/094,796

(22) Filed: Apr. 26, 2011

(65) Prior Publication Data
US 2012/0273874 A1  Nov. 1, 2012

(51) Int. Cl.
*H01L 29/78* (2006.01)
*H01L 21/336* (2006.01)
*H01L 27/108* (2006.01)
*H01L 29/66* (2006.01)

(52) U.S. Cl.
CPC .... *H01L 27/10885* (2013.01); *H01L 29/66666* (2013.01); *H01L 29/7827* (2013.01)
USPC ............... 257/330; 257/E21.41; 257/E29.262

(58) Field of Classification Search
CPC ............... H01L 27/10876; H01L 27/10885; H01L 29/66666; H01L 29/7827
USPC ...................................... 257/329, 330
See application file for complete search history.

(56) References Cited

U.S. PATENT DOCUMENTS

2008/0179666 A1*  7/2008  Foerster et al. ............... 257/330
2010/0052029 A1*  3/2010  Huang .......................... 257/309

* cited by examiner

*Primary Examiner* — Alexander Ghyka
(74) *Attorney, Agent, or Firm* — Winston Hsu; Scott Margo (57) ABSTRACT

A method of forming a buried bit line is provided. A substrate is provided and a line-shaped trench region is defined in the substrate. A line-shaped trench is formed in the line-shaped trench region of the substrate. The line-shaped trench includes a sidewall surface and a bottom surface. Then, the bottom surface of the line-shaped trench is widened to form a curved bottom surface. Next, a doping area is formed in the substrate adjacent to the curved bottom surface. Lastly, a buried conductive layer is formed on the doping area such that the doping area and the buried conductive layer together constitute the buried bit line.

16 Claims, 14 Drawing Sheets

MEMORY DEVICE HAVING BURIED BIT LINE AND VERTICAL TRANSISTOR AND FABRICATION METHOD THEREOF

BACKGROUND OF THE INVENTION

1. Field of the Invention

The present invention relates generally to the field of memory technology, and more particularly, to a 4F2 memory cell having a circle-segment-shaped buried bit line and a vertical transistor above the buried bit line. The present invention further provides a method for fabricating the novel buried bit line structure and the vertical transistor.

2. Description of the Prior Art

In order to accelerate operating speed of integrated circuits and to meet customers' demands for miniaturizing electronic devices, physical dimensions of transistors in a semiconductor apparatus are continuously reduced. With the reduction in physical dimensions of transistors, the length of channel regions in the transistors is reduced as well. Thus, a severe short channel effect would occur in the transistors, and its ON current is likely to decrease.

A conventional solution to this issue is to enhance the dopant concentration in the channel region. However, this method causes an increased leakage current and therefore affects the reliability of devices. Another approach is to use a vertical transistor structure. For example, the vertical transistor structure is formed in the deep trench of the substrate so the operating speed and integration of integrated circuits are enhanced and short channel effect can be alleviated. Currently, improvements in structural design and channel control of the existing vertical transistors are studied aggressively in this field.

SUMMARY OF THE INVENTION

It is one objective of the present invention to provide a buried bit line structure and a vertical transistor structure with enhanced operating speed and integration of integrated circuits.

According to one aspect of the claimed invention, a method of forming a buried bit line is provided. A substrate is provided and a line-shaped trench region is defined in the substrate. A line-shaped trench is formed in the line-shaped trench region of the substrate. The line-shaped trench includes a sidewall surface and a bottom surface. Then, the bottom surface of the line-shaped trench is widened to form a curved bottom surface. Next, a doping area is formed in the substrate adjacent to the curved bottom surface. Lastly, a buried conductive layer is formed on the doping area.

According to another aspect of the claimed invention, a vertical transistor is provided. The vertical transistor includes a substrate, a gate, a first source region and a second region, a drain region, a channel region and a gate dielectric layer. The substrate includes a trench where the gate is disposed therein. The source region is disposed in the substrate beneath the gate. The source region includes a first source region and a second source region, both of which have a half-moon shape in a cross-section. The drain region is disposed above the gate. The channel region is disposed at two sides of the gate and located between the source region and the drain region. The gate dielectric layer located between the gate and the channel region.

The method provided in the present invention can fabricate the buried bit lines and the STI simultaneously, so the overall steps of making vertical transistor can be streamlined. In addition, the method provided in the present invention can be carried out by self-alignment, thus the buried bit line can be formed more accurately and the characteristics of the devices can be enhanced.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
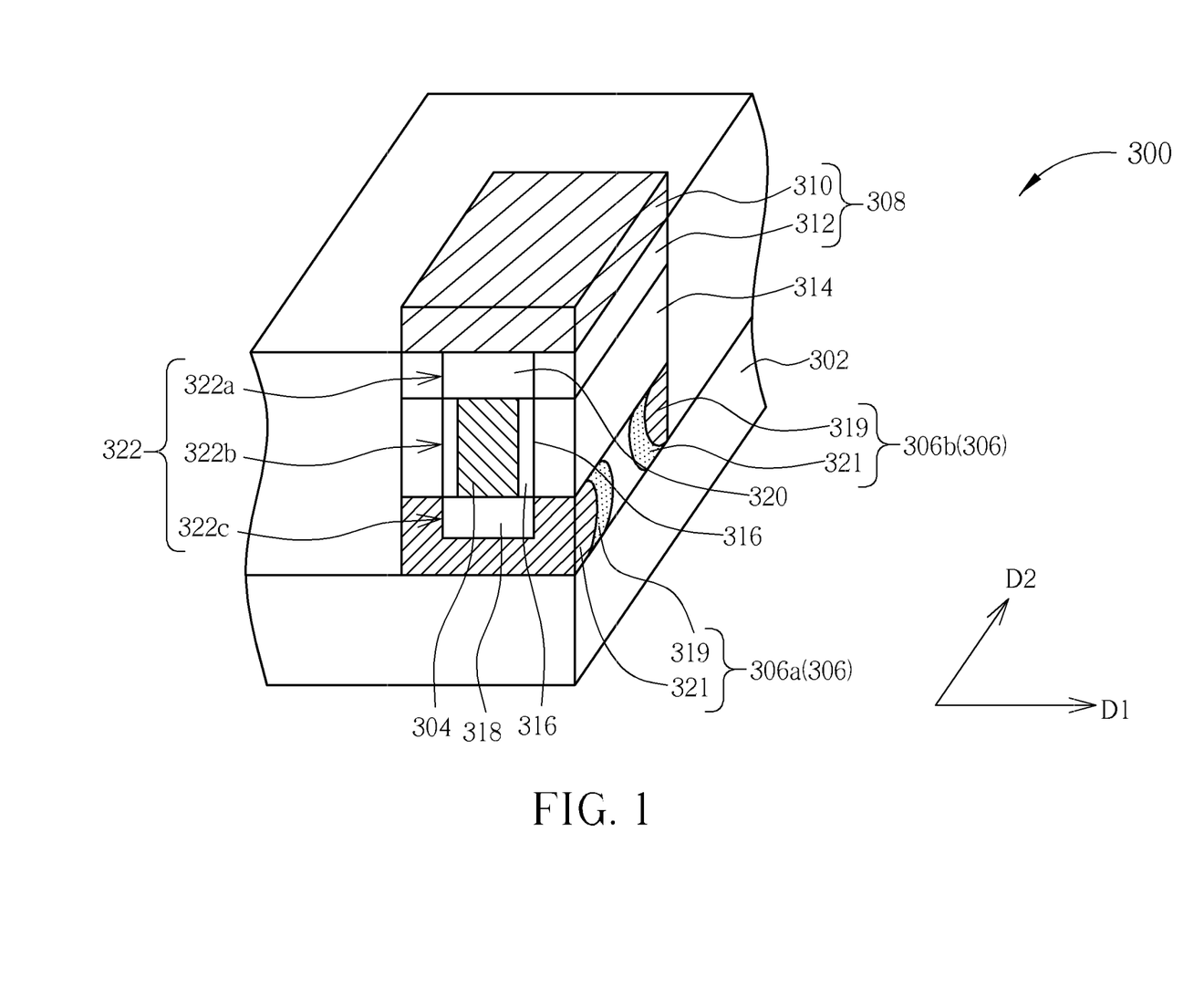
FIG. 1 illustrates a schematic diagram of the vertical transistor in the present invention.

FIG. 1 illustrates a schematic diagram of the vertical transistor according to one embodiment of the present invention. As shown in FIG. 1, the vertical transistor 300 includes a substrate 302, a gate 304, a source terminal region 306, a drain terminal region 308, a channel region 314, a gate dielectric layer 316 and two dielectric layers 318, 320.

The gate 304, the gate dielectric layer 316, the dielectric layer 318 and the dielectric layer 320 are disposed in a trench 322 formed in the substrate 302. The trench 322 has a top portion 322a, a middle portion 322b and a bottom portion 322c. In one embodiment, the dielectric layer 320 is disposed in the top portion 322a of the trench 322, the dielectric layer 318 is disposed in the bottom portion 322c of the trench 322, and the gate dielectric layer 316 is disposed on a sidewall of the middle portion 322b of the trench 322. That is, the gate 304 is surrounded by the dielectric layer 320, the dielectric layer 318 and the gate dielectric layer 316.

The source terminal region 306 is disposed in the substrate 302 beneath the gate 304. The dielectric layer 318 is located between the source terminal region 306 and the gate 306, so that the source terminal region 306 is insulated from the gate 306. The source terminal region 306 includes a first source terminal region 306a and a second source terminal region 306b, both of which include a source doping area 319 and a buried bit line 321. As shown in the cross-sectional view in FIG. 1, the source doping area 319 has a crescent shape while the buried bit line 321 has a circle-segment shape, together forming the first source terminal region 306a (or the second source terminal region 306b) with a half-moon shape. In one embodiment, the arc portions of the half-moon shape of the first source terminal region 306a and the second source terminal region 306b are confronted to each other The drain terminal region 308 is disposed above the gate 304. The dielectric layer 320 is located between the drain terminal region 308 and the gate 304, so that the drain terminal region 308 is insulated from the gate 304. In one embodiment, the drain terminal region 308 includes two doped areas 312 and a conductive block 310. The doping areas 312, for example, are disposed in the substrate 302 on two opposite sides of the gate 304. That is, the doping areas 312 are located on two sides of the top portion 322a of the trench 322 and are separated by the dielectric layer 320. The conductive block 310 is disposed on the substrate 302 and electrically connected to the doping areas 312.

The channel region 314 is disposed on two opposite sides of the gate 304 and located between the source terminal region 306 and the drain terminal region 308. The gate dielectric layer 316 is disposed between the gate 304 and the channel region 314.

In one embodiment, the substrate 302 may be a silicon substrate, an epitaxial silicon substrate, a silicon germanium substrate, or a silicon-on-insulator (SOI) substrate. The gate 304 may include metal such as silver, copper, tungsten, titanium, platinum or poly Si. The doping areas 321 of the source terminal region 306 and the doping areas 312 of the drain terminal region 308 may have the same conductive type, for example, n-type. The buried bit line 321 of the source terminal region 306 and the conductive block 310 of the drain region are made of conductive materials such as metal or poly-silicon, for instance. The gate dielectric layer 316, the dielectric layers 318, 320 are, for example, made of silicon oxide, silicon nitride, or other suitable dielectric materials. It should be noted that the material or the structure of the vertical transistor 300 is not limited to aforementioned descriptions.

Figure 2:
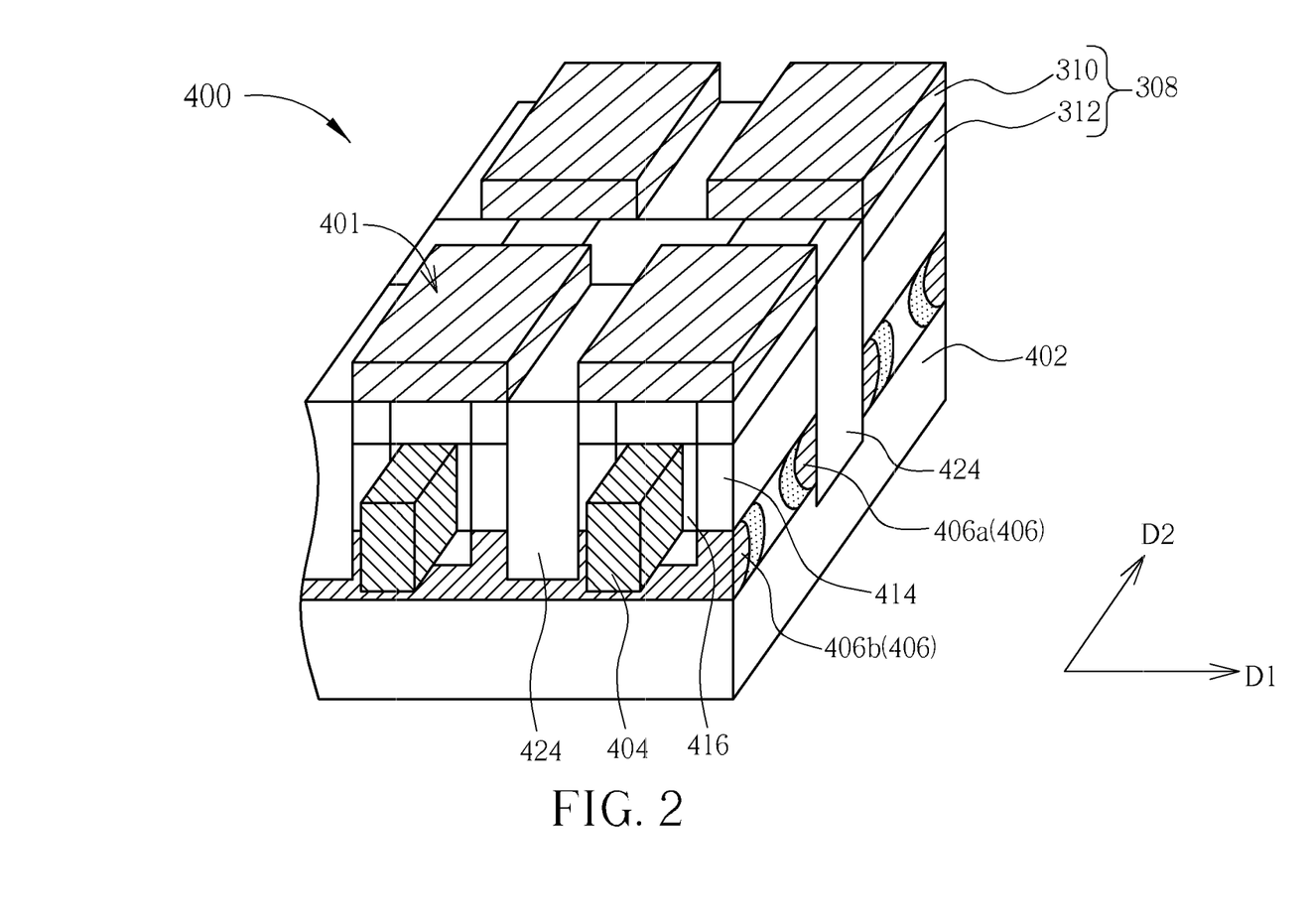
FIG. 2 illustrates a schematic diagram of the array of the vertical transistor in the present invention.

FIG. 2 illustrates a schematic diagram of the array of the vertical transistor according to one embodiment of the present invention. As shown in FIG. 2, the vertical array 400 includes a substrate 402, a plurality of vertical transistors 401, a plurality of gate lines 404, a plurality of bit lines 406 and an isolation structure 424. The embodiments of the substrate 402 and the vertical transistors 401 are similar to those abovementioned.

The isolation structure 424, such as a shallow trench isolations (STI), is disposed in the substrate 402 and encompasses each of the vertical transistor 401. The isolation structure 424 may be made of silicon oxide, silicon nitride or other suitable dielectric materials. The gate lines 404 are disposed in the substrate 402 and are parallel to each other along a first direction D1. The gate lines 404 connect each of the vertical transistor 401 in the same column and form each of the gates 304 therein. The bit lines 406 are disposed in the substrate 402 beneath the gate lines 404 and are parallel to each other along a second direction D2. In one embodiment, the first direction D1 and the second direction D2 are substantially perpendicular to each other. The bit lines 406 connect each of the vertical transistor 401 in the same row. As shown in the cross-sectional view taken from the second direction D2 in FIG. 2, the first buried bit line 406a and a second buried bit line 406b has a circle-segment shape. The arc portions of the circle-segment shape of the first buried bit line 406a and the second buried bit line 406b are confronted to each other, and the secant lines of the first buried bit line 406a and the second buried bit line 406b respectively face the isolation structure 424 and directly contact the isolation structure 424.

Figure 3:
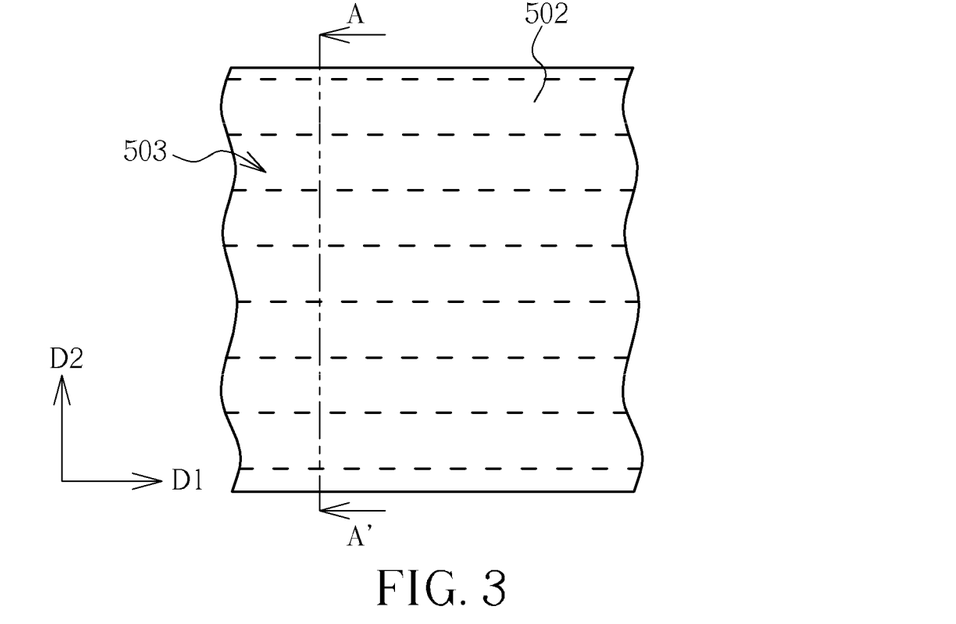
FIG. 3 to FIG. 10 illustrate schematic diagrams of the method of forming a buried bit line.

FIG. 3 to FIG. 10 illustrates schematic diagrams of the method of fabricating the buried bit line according to one embodiment of the present invention, wherein FIG. 4 to FIG. 10 are cross-sectional views taken along line AA' of FIG. 3.

As shown in FIG. 3, a substrate 502 is provided. The substrate 502 may be a silicon substrate, an epitaxial silicon substrate, a silicon germanium substrate, or a silicon-on-insulator (SOI) substrate. A plurality of line-shaped trench regions 503 are defined on the substrate 502. In one embodiment, the line-shaped trench regions 503 are parallel to each other along a second direction D1. In the subsequent steps, a plurality of isolation structures will be formed in the line-shaped trench regions 503.

Figure 4:
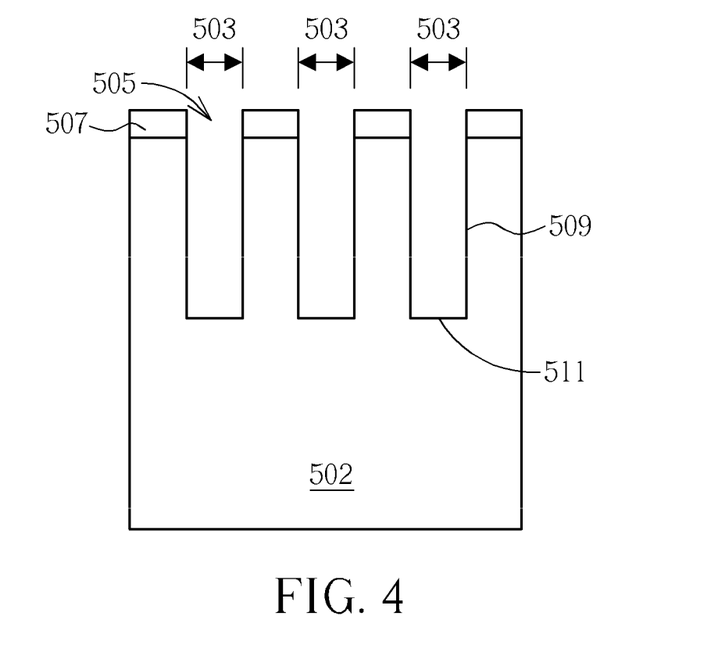

As shown in FIG. 4, a plurality of line-shaped trenches 505 are formed in the line-shaped trenches 503 in the substrate 502. For example, a patterned hard mask layer 507 is formed by a photo-lithography process. Next, the substrate 502 is etched by using the patterned hard mask 507 as a mask to form the line-shaped trenches 503. Each line-shaped trench 503 includes a sidewall surface 509 and a bottom surface 511.

Figure 5:
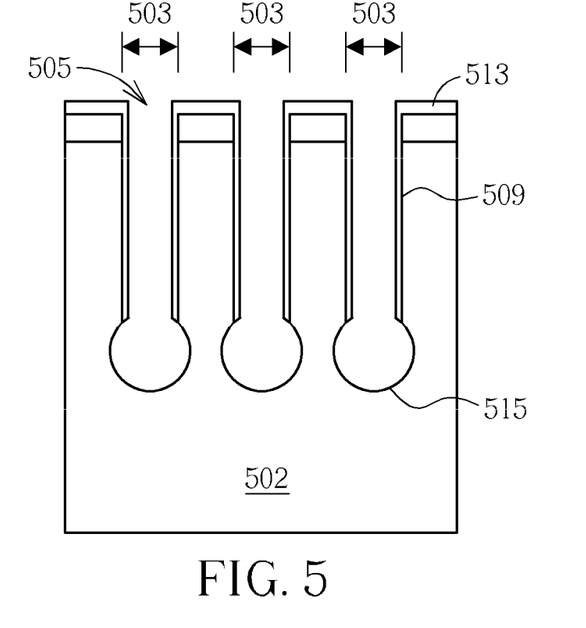

As shown in FIG. 5, a liner 513 is formed on the substrate 502 and the sidewall surface 509 of the line-shaped trench 505. In one embodiment, the liner 513 may be made of metal oxide such as aluminum oxide ($Al_2O_3$) which can be formed by atomic layer deposition (ALD), for instance. After forming the liner 513, a wet etching step is performed to widen the bottom surface 511 of the line-shaped trench 505. The wet etching step, for example, can use hydrogen fluoride (HF) to isotropically etch the bottom surface 511 to form a curved bottom surface 515 which has a nearly round shape in the cross-section. Because the bottom surface 511 is widened by the wet etching process, a part of the curved bottom surface 515 is located outside the line-shaped trench region 503. With the protection of the liner 513, the sidewall surface 509 is not etched away.

Figure 6:
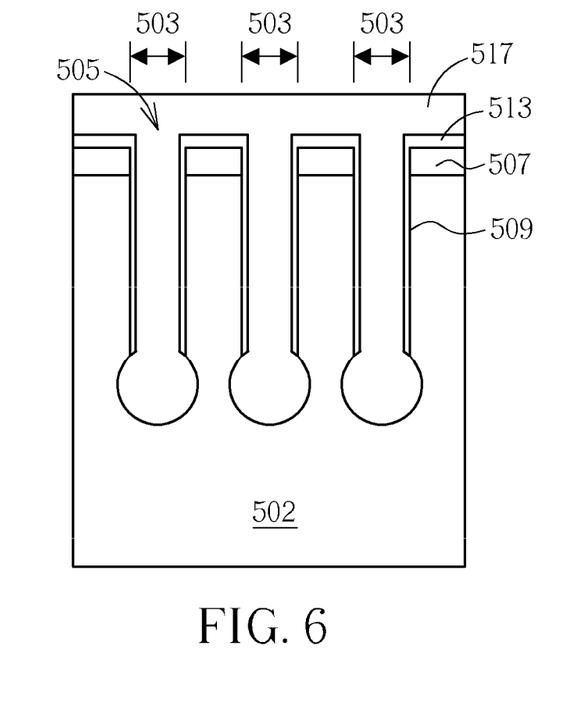

As shown in FIG. 6, a material layer 517 is formed on the substrate 502 to completely fill up the line-shaped trench 505. In one embodiment, the material layer 517 includes polysilicon. The method of forming the material layer 517 may include a chemical vapor deposition (CVD) or a physical vapor deposition (PVD) which provides good gap filling ability.

Figure 7:
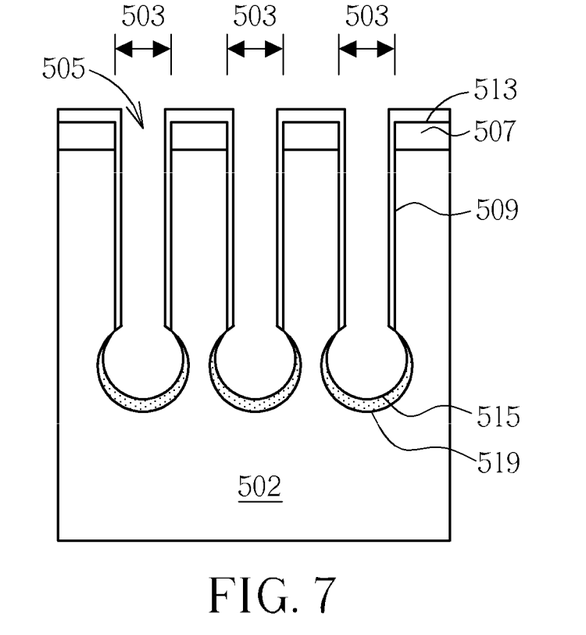

Next, as shown in FIG. 7, an annealing process is performed to make dopants in the material layer 517 diffuse into the substrate 502, thereby forming the doping area 519. It is understood that the doping area 519 has a ring-shaped structure and is located adjacent to the curved bottom surface 515. In another embodiment, the doping area 519 can be formed by other methods such as ion implant or gas phase doping (GPD). The gas phase doping process, for example, may include supplying a doping gas to the line-shaped trench 505 and then performing an annealing process form the doping area 519 adjacent to the curved bottom surface 515. The doping gas, for instance, may include arsenic (As). In another embodiment, another doping area (not shown) can be formed on the sidewall 509 of the trench 505 before performing the wet etching.

Figure 8:
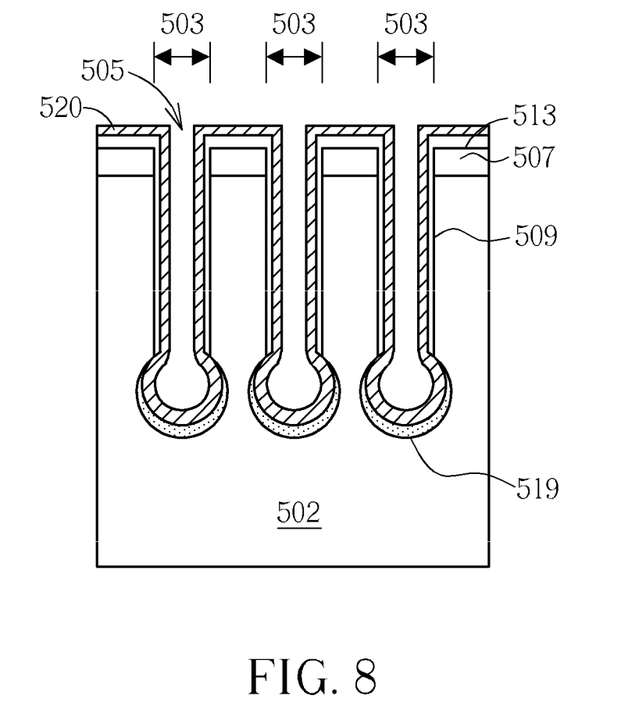

As shown in FIG. 8, a conductive layer 520 is formed on the substrate 502 by a deposition process. The conductive layer 520 may be metal such as Ti or TiN. In one embodiment, the conductive layer 520 can be formed conformally along the curved bottom surface 515 and the sidewall surface 509 of the line-shaped trench 505, but the line-shaped trench 505 is not completely filled with the conductive layer 520. In another embodiment, the line-shaped trench 505 may be completely filled with the conductive layer 520.

Figure 9:
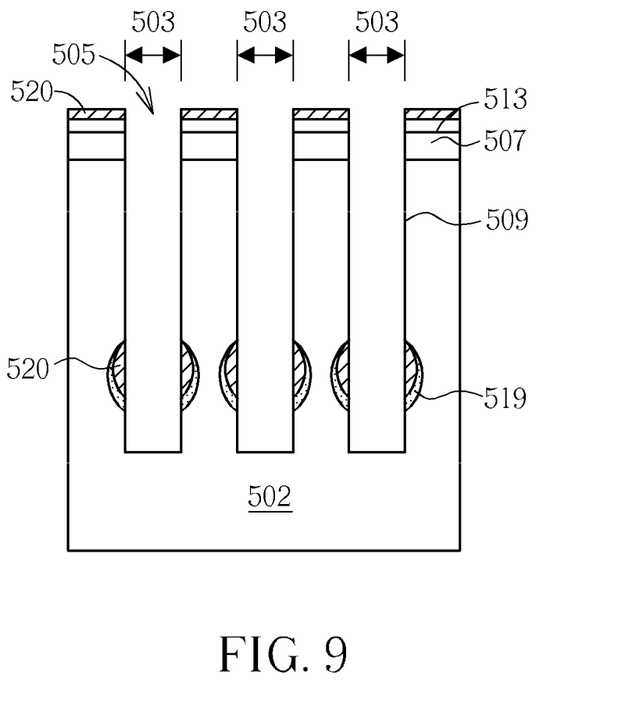

As shown in FIG. 9, a dry etching process is performed to remove the conductive layer 520, the liner 513 and the doping area 519 in the line-shaped trench region 503. In one embodiment, the etching process further removes the substrate 502 under the curved bottom surface 515 in the line-shaped trench region 503.

Figure 10:
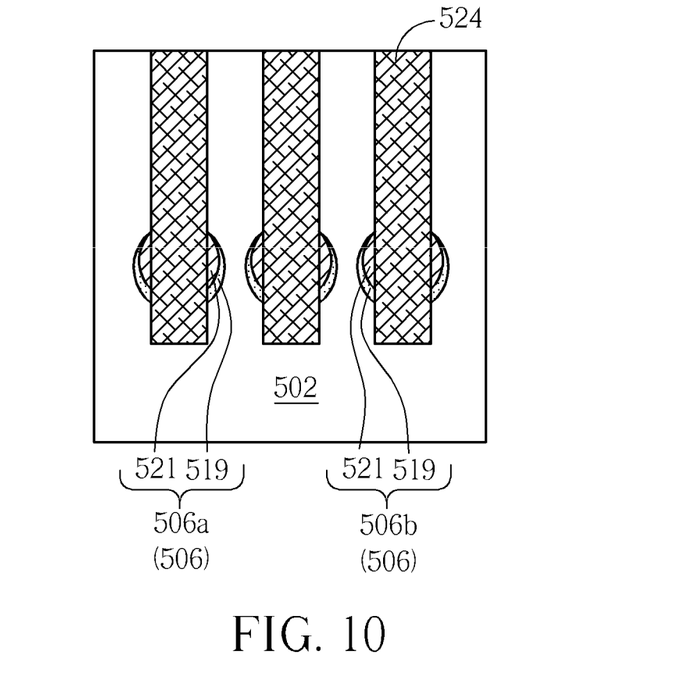

As shown in FIG. 10, an insulation layer such as silicon oxide is filled into the line-shaped trench 505. A planarization process such as CMP is performed to remove the insulation layer, the conductive layer 520, the liner 513, the patterned hard mask layer 507, thereby forming a plurality of isolation structures 524 respectively in the line-shaped trench region 503. As shown in FIG. 10, the conductive layer 520 becomes the buried bit line 521. The doping area 519 and the buried bit line 521 together form the source terminal region 506 which is juxtaposed to the isolation structure 524. A first source terminal region 506a and a second source terminal region 506b are formed between two isolation structures 524. As shown in FIG. 10, both the first source terminal region 506a and the second source terminal region 506b have a half-moon shape. The arc portions of the half-moon shape of the first source terminal region 506a and the second source terminal region 506b are confronted to each other, and the secant lines of the first source terminal region 506a and the second source terminal region 506b respectively face the isolation structure 524 and directly contact the isolation structure 524. In one embodiment, the doping area 519 can be adjusted by increasing the doping area such that the two adjacent doping areas 519 of the first source terminal region 506a and the second source terminal region 506b can be electrically connected to each other so as to form a continuous doping region.

Figure 12:
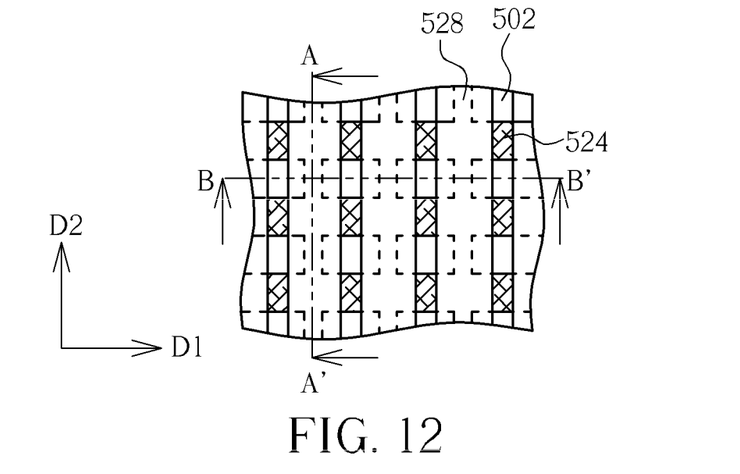
Figure 12A:
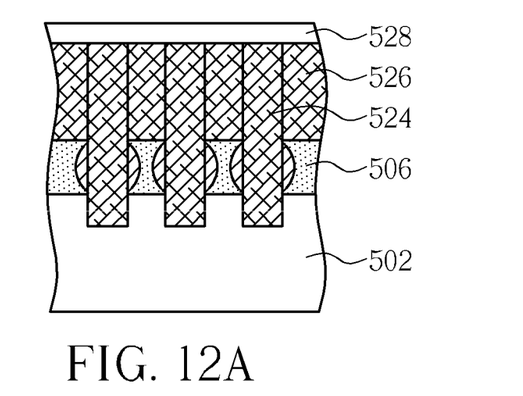
Figure 12B:
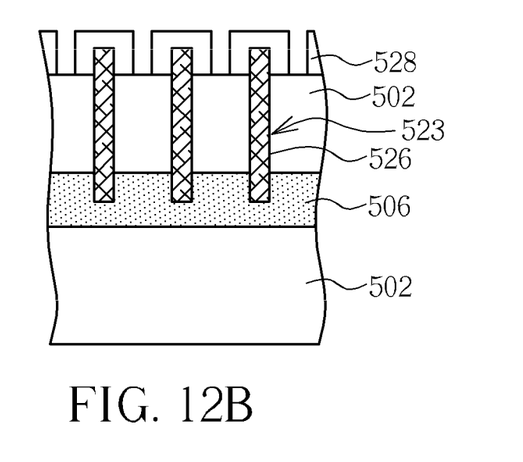
Figure 13:
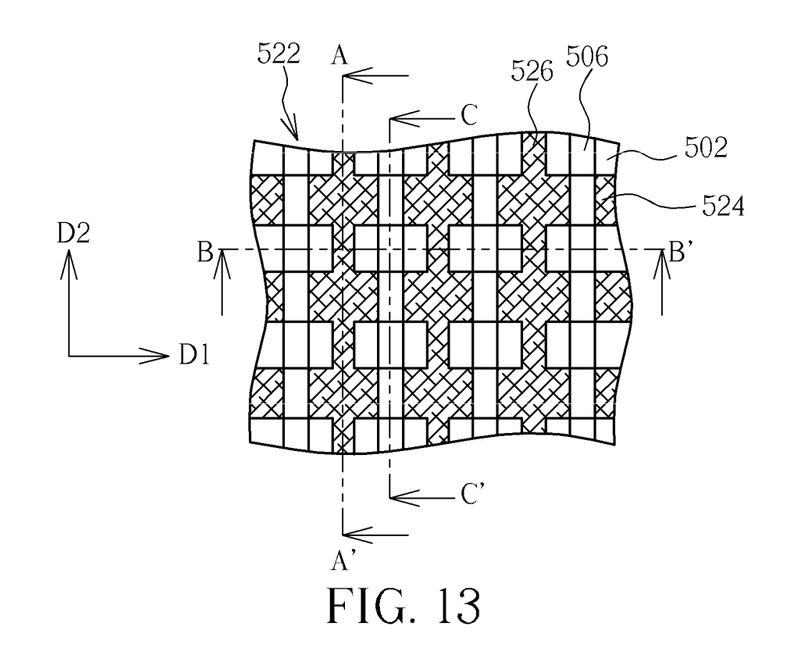
Figure 13A:
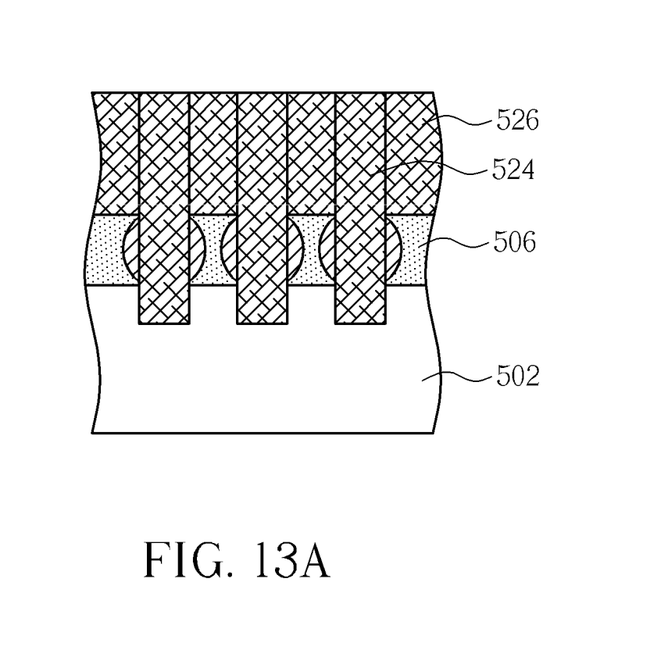
Figure 13B:
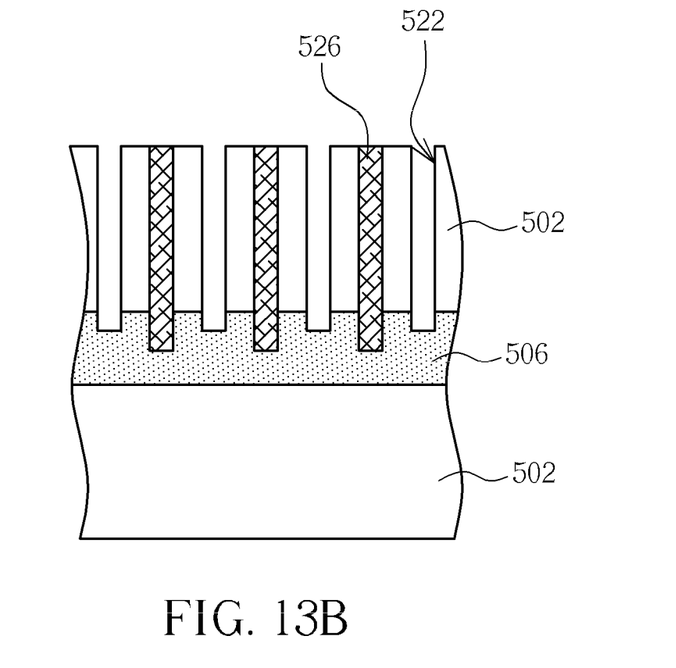
Figure 13C:
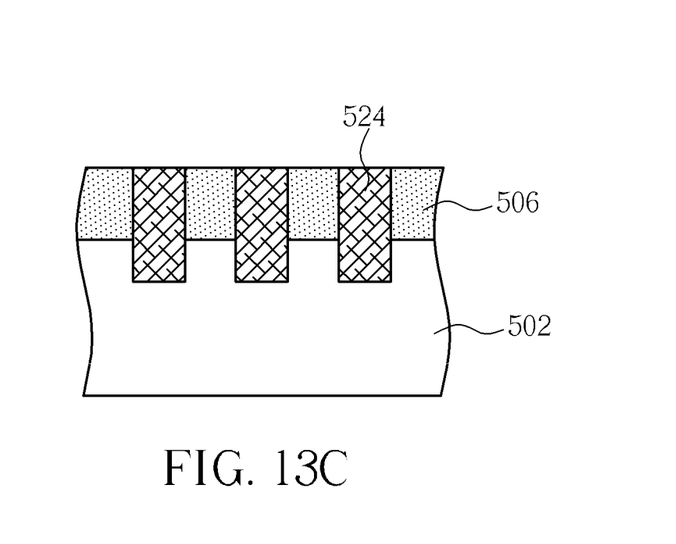

The above-mentioned description provides a method for forming a source terminal region, a buried bit line and an isolation structure simultaneously. In the next context, a method for forming a vertical transistor is provided continuously base on the embodiment shown in FIG. 3 to FIG. 10. Please refer to FIG. 11 to FIG. 15. FIG. 11, 12, 13, 14 and 15 are top views schematic diagrams of the method forming the vertical transistor in the present invention. FIG. 11A, 12A, 13A, 14A and 15A are cross-sectional views taken along line AA' of FIG. 11, 12, 13, 14 and 15, respectively. FIG. 11B, 12B, 13B, 14B and 15B are cross-sectional views taken along line BB' of FIG. 11, 12, 13, 14 and 15, respectively. FIG. 13C, 14C and 15C are cross-sectional views taken along line CC' of FIG. 13, 14 and 15, respectively.

Figure 11:
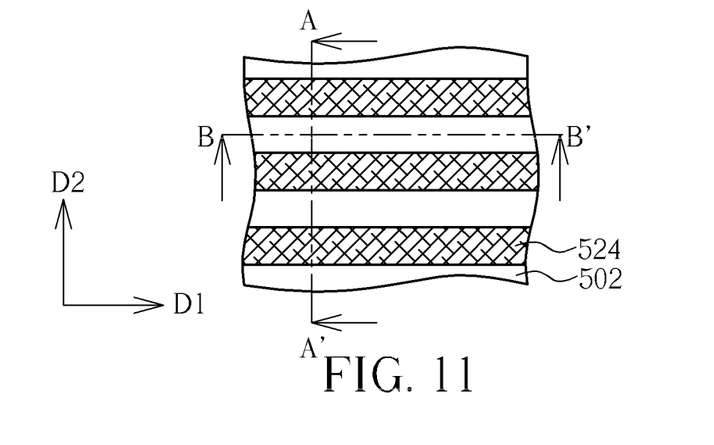
FIG. 11 to FIG. 15 illustrate schematic diagrams of the method of forming the vertical transistor in the present invention.
Figure 11A:
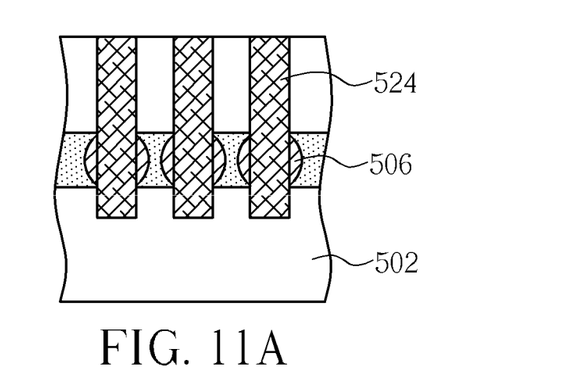
Figure 11B:
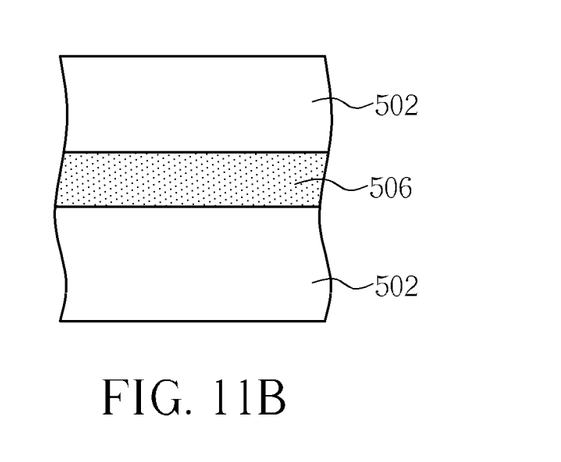

Please refer to FIG. 11, 11A and 11B. The isolation structures 524 and the source terminal regions 506 have been formed in the substrate 502 according to the steps shown in FIG. 3 to FIG. 10. Next, as shown in FIG. 12, 12A and 12B, the substrate 502 is patterned to form a plurality of trenches 523 in the substrate 502, and the isolation structures 526 are formed in the trenches 523. The isolation structures 526 protrude from a surface of the substrate 502. Thereafter, a patterned mask layer 528 is formed on the substrate 502 and exposes a portion of the substrate 502. In the present embodiment, the isolation structure 526 is made of silicon nitride, silicon oxide, or other suitable insulating materials, for example. The patterned mask layer 528 is made of silicon oxide, for example.

As shown in FIG. 13, 13A, 13B and 13C, the patterned mask layer 528 is used as a mask to remove a portion of the substrate 502 to form a plurality of trenches 522 in the substrate 502. Herein, the trenches 522 extend along a second direction D2, where the second direction D2 is perpendicular to the first direction D1, for example.

Afterwards, the patterned mask layer 528 and the protrusion of the isolation structure 526 are removed to flatten the surface of the substrate 502. In the present embodiment, the patterned mask layer 528 and the protrusion of the isolation structure 526 are partially removed by using a dry-etching method or other suitable methods, for example. Thereafter, the remained patterned mask layer 528 and the protrusion of the isolation structure 526 are removed by, for example, using a chemical mechanical polishing process or other suitable methods flatten the surface of the substrate 502.

Figure 14:
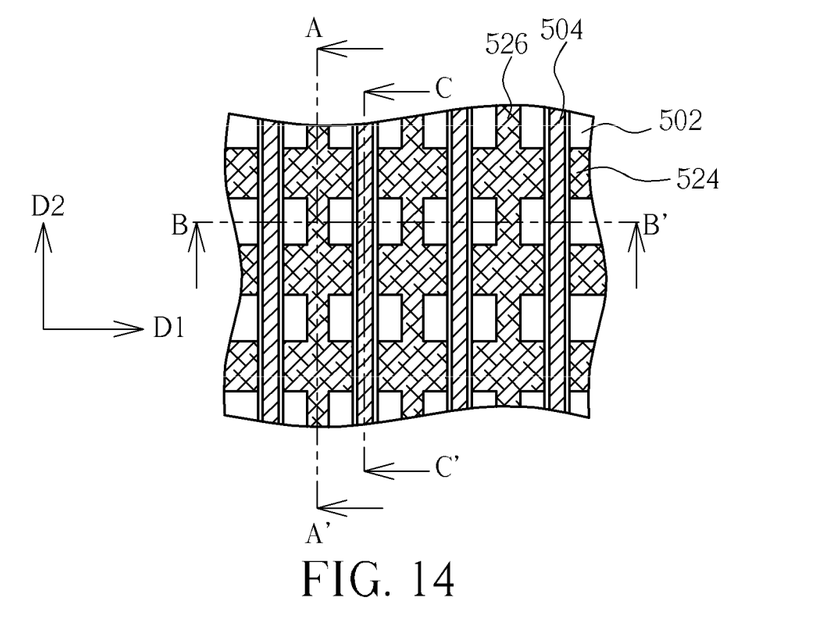
Figure 14A:
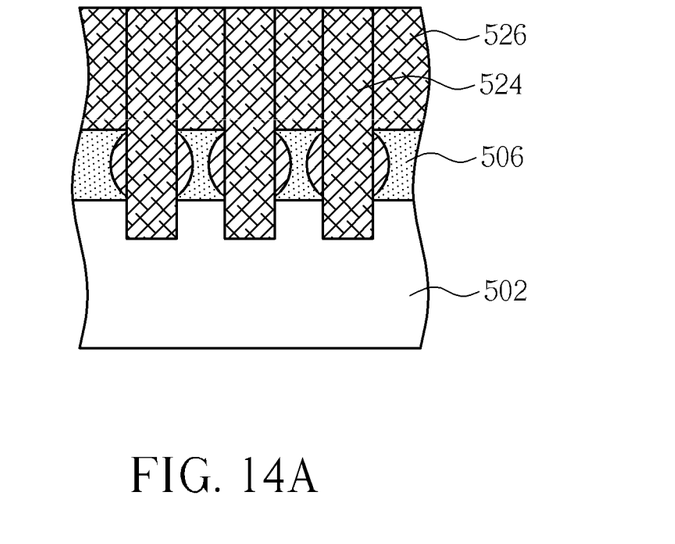
Figure 14B:
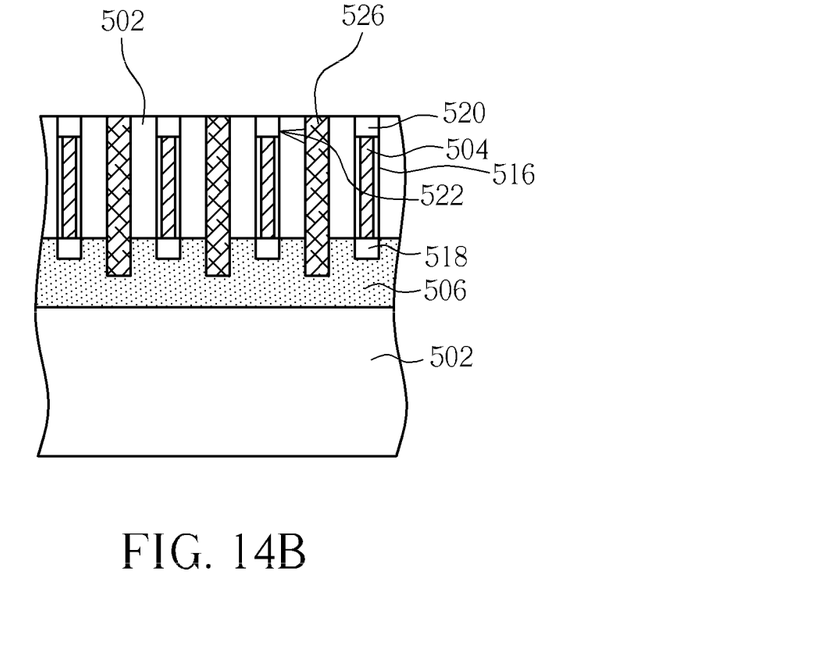
Figure 14C:
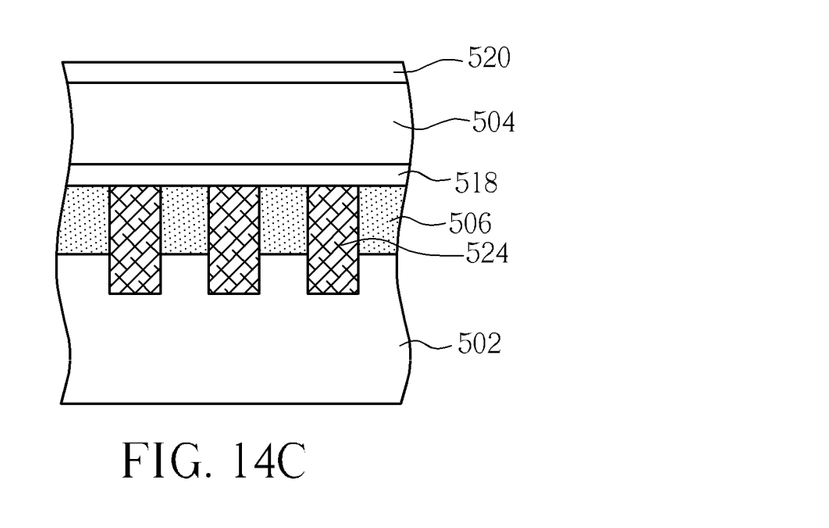
Figure 15:
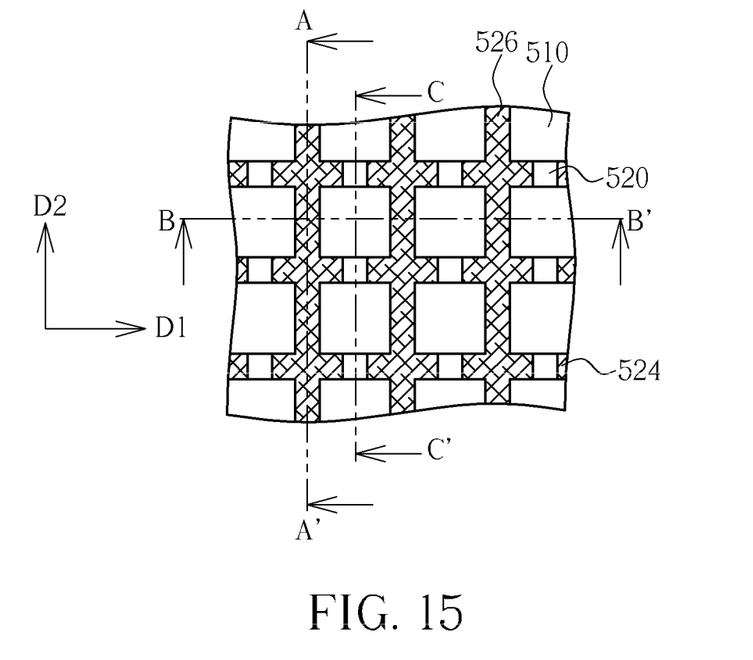
Figure 15A:
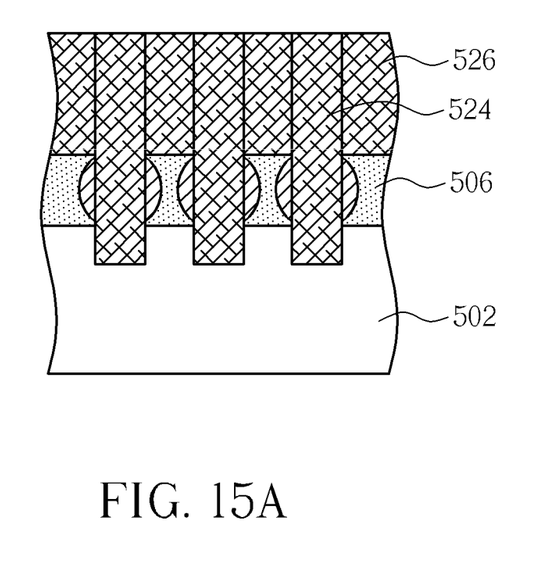
Figure 15B:
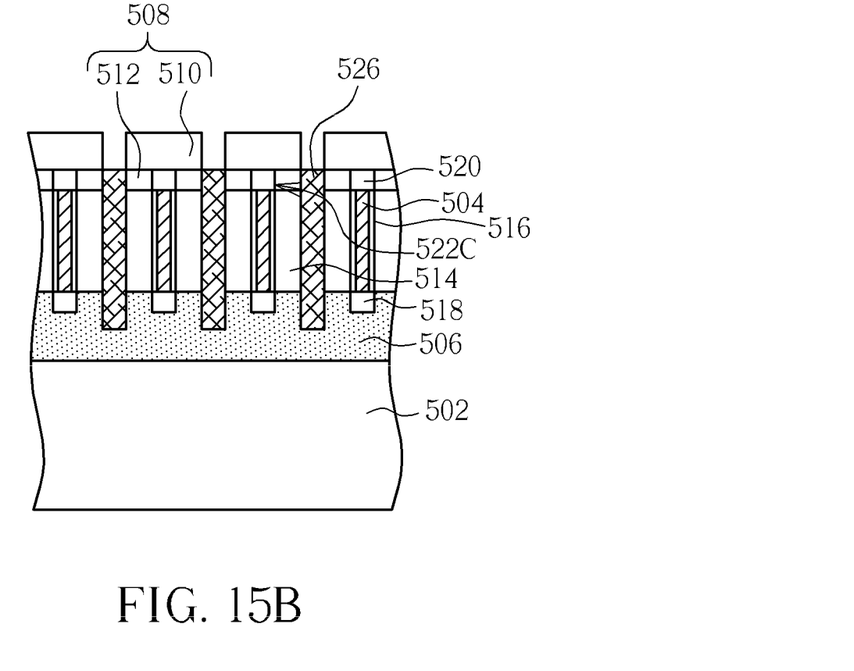
Figure 15C:
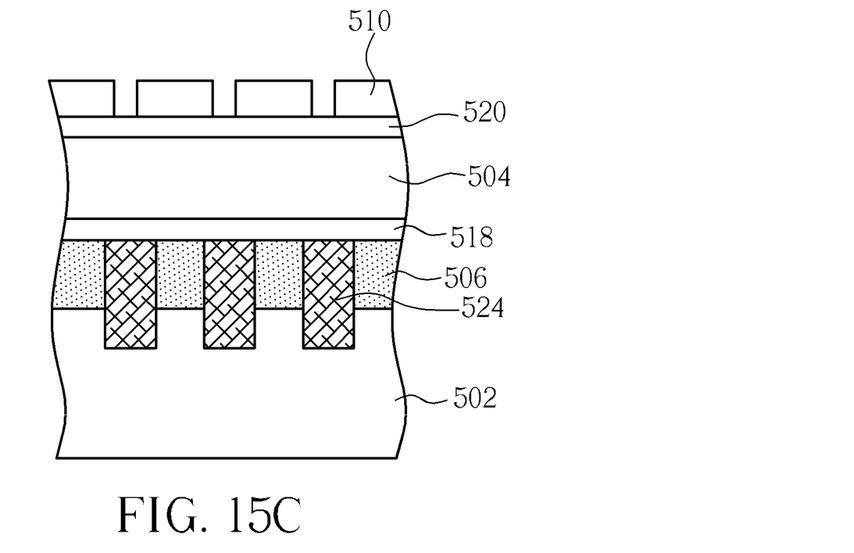

As shown in FIG. 14, 14A, 14B and 14C, a plurality of dielectric layers 518 is formed at a bottom portion 522b of the trench 522 and each gate dielectric layer 516 is formed on a sidewall of the middle portions 522a of the trench 522. Later, each gate line 504 is formed in the trench 522. As shown in FIGS. 14 and 14B, the gate lines 504 are disposed in the substrate 502 in parallel along the second direction D2 and are disposed above the bit lines 506. Next, each dielectric layer 520 is formed on a top portion 522c of the trench 522 to cover the gate lines 504. In the present embodiment, the dielectric layers 518, 520 and the gate dielectric layers 516 are made of silicon oxide, for example. The dielectric layers 518, 520 are formed by a CVD, for instance. The gate dielectric layers 516 are formed by a thermal oxidation process, for example. The gate lines 504 are, for example, made of metal, and formed by, for example, a CVD.

As shown in FIG. 15, 15A, 15B and 15C, a plurality of drain terminal regions 508 are then formed in the substrate 502. In the present embodiment, a method of forming the drain terminal regions 508 is illustrated below. The doping areas 512 are first formed in the substrate 502 at respective sides of the top portion 522c of the trench 522, for example. The conductive block 510 is then formed on the doping areas 512. The conductive block 510 is electrically connected to the doping areas 512. The doping areas 512 and the doping areas (not explicitly shown) of the bit lines 506 have the same conductive type, and are formed by implanting an n-type dopant into the substrate 502, for instance. Thus, the doping areas 512 are n-type silicon layers, for example. The conductive block 510 is made of, for example, poly-silicon, and formed by a CVD, for example. In one embodiment, the doping areas 512 may be formed by a diffusion method.

After the formation of the drain terminal regions 508, a channel region 514 is formed at two sides of each gate line 504 and located between a corresponding bit line 506 and a corresponding drain region 508. The gate dielectric layers 516 are disposed between the channel regions 514 and the gate lines 504. The vertical transistor is therefore formed.

In summary, the present invention provides a method of forming the buried bit lines and the vertical transistor. The method provided in the present invention can fabricate the buried bit lines and the STI simultaneously, so the overall steps of making the vertical transistors can be streamlined. In addition, the method provided in the present invention can be carried out by self-alignment, and the buried bit line can therefore be formed more accurately, thereby enhancing the operating speed of the devices. The present invention further provides a novel vertical transistor structure with the buried bit lines.

Those skilled in the art will readily observe that numerous modifications and alterations of the device and method may be made while retaining the teachings of the invention.

What is claimed is:

1. A vertical transistor, comprising:
   a substrate having a trench;
   a gate disposed in the trench and extending along a first direction;
   a source region disposed in the substrate beneath the gate, wherein the source region comprises a first source region and a second source region that is spaced apart from the first source region, both the first source region and the second source region have a half-moon shape;
   a drain region disposed above the gate;
   a channel region between the source region and the drain region, wherein the channel region is separated by the gate into two split, vertical channels; and
   a gate dielectric layer located between the gate and the channel region.

2. The vertical transistor according to claim 1, wherein both the first source region and the second source region comprise a doping area and a buried bit line extending along a second direction, wherein the first direction is substantially perpendicular to the second direction.

3. The vertical transistor according to claim 2, wherein the doping area comprise a crescent shape.

4. The vertical transistor according to claim 2, wherein the buried bit line comprise a circle-segment shape.

5. The vertical transistor according to claim 2, wherein the arc portions of the half-moon shape of the first source region and the second source region are confronted to each other.

6. The vertical transistor according to claim 1, wherein the gate dielectric layer is disposed on a sidewall of the trench.

7. The vertical transistor according to claim 1, further comprising a dielectric layer located between the gate and the source region.

8. The vertical transistor according to claim 7, wherein the dielectric layer is disposed at a bottom of the trench.

9. The vertical transistor according to claim 1, further comprising a dielectric layer located between the gate and the drain region.

10. The vertical transistor according to claim 1, wherein the drain region is located in the substrate above the gate.

11. The vertical transistor according to claim 10, wherein a method of forming the drain region comprises an implantation method or a diffusion method.

12. The vertical transistor according to claim 1, wherein the drain region comprises two doping areas and a conductive block, the doping areas are located in the substrate above two sides of the gate, and the conductive block is located on the substrate and electrically connected to the doping areas.

13. The vertical transistor according to claim 12, wherein a method of forming the doping areas comprises an implantation method or a diffusion method.

14. The vertical transistor according to claim 13, wherein a material of the conductive block comprises poly-silicon.

15. The vertical transistor according to claim 1, wherein the source region and the drain region have the same conductive type.

16. The vertical transistor according to claim 1, wherein a material of the gate comprises metal.

* * * * *